(12) United States Patent
Motonaga et al.

(10) Patent No.: US 6,780,547 B2
(45) Date of Patent: Aug. 24, 2004

(54) HALFTONE PHASE SHIFTING PHOTOMASK AND BLANKS FOR HALFTONE PHASE SHIFTING PHOTOMASK THEREFOR AND A METHOD FOR FORMING PATTERN BY USING THE HALFTONE PHASE SHIFTING PHOTOMASK

(75) Inventors: Toshiaki Motonaga, Tokyo (JP); Norihito Ito, Tokyo (JP); Chiaki Hatsuta, Tokyo (JP); Junji Fujikawa, Tokyo (JP); Naoya Hayashi, Tokyo (JP); Toshio Onodera, Fujisawa (JP); Takahiro Matsuo, Fujisawa (JP); Toru Ogawa, Kawasaki (JP); Keisuke Nakazawa, Tokyo (JP)

(73) Assignees: Dainippon Printing Co., Ltd., Tokyo (JP); Semiconductor Leading Edge Technologies, Inc., Kanagawa-ken (JP)

( * ) Notice: Subject to any disclaimer, the term of this patent is extended or adjusted under 35 U.S.C. 154(b) by 312 days.

(21) Appl. No.: 09/825,578

(22) Filed: Apr. 3, 2001

(65) Prior Publication Data

US 2002/0015187 A1 Feb. 7, 2002

(30) Foreign Application Priority Data

Apr. 4, 2000 (JP) .................................. 2000-101907

(51) Int. Cl.$^7$ ................................................. G03F 9/00
(52) U.S. Cl. ......................................................... 430/5
(58) Field of Search ...................... 430/5, 322; 428/696, 428/698, 472; 427/582

(56) References Cited

U.S. PATENT DOCUMENTS

| | | | |
|---|---|---|---|
| 4,890,309 A | 12/1989 | Smith et al. | 378/35 |
| 5,629,115 A | 5/1997 | Kawano et al. | 430/5 |
| 5,738,959 A | * 4/1998 | Miyashita et al. | 430/5 |
| 5,907,393 A | 5/1999 | Kawano et al. | 430/5 |
| 5,916,712 A | 6/1999 | Miyashita et al. | 430/5 |
| 5,938,897 A | 8/1999 | Isao et al. | 430/5 |

FOREIGN PATENT DOCUMENTS

| | | |
|---|---|---|
| EP | 0090924 | 10/1983 |
| JP | 58-173744 | 10/1983 |
| JP | 62-59296 | 12/1987 |
| JP | 5-2259 | 1/1993 |
| JP | 5-127361 | 5/1993 |
| JP | 7-110572 | 4/1995 |
| JP | 09-244212 | 9/1997 |

\* cited by examiner

*Primary Examiner*—S. Rosasco
(74) *Attorney, Agent, or Firm*—Flynn, Thiel, Boutell & Tanis, P.C.

(57) ABSTRACT

In a halftone phase shifting photomask 108, having a pattern of halftone phase shifting film 102 containing at least chromium and fluorine, the halftone phase shifting film is heat-treated at a temperature between 250° C. and 500° C. so that a change of the optical property of the film produced by the application of excimer laser for exposure to the film is decreased.

19 Claims, 11 Drawing Sheets

CHANGE OF PHASE DIFFERENCE OF AFTER IRRADIATION

TRANSMITTANCE CHANGE OF AFTER IRRADIATION

HALFTONE PHASE SHIFTING PHOTOMASK AND BLANKS FOR HALFTONE PHASE SHIFTING PHOTOMASK THEREFOR AND A METHOD FOR FORMING PATTERN BY USING THE HALFTONE PHASE SHIFTING PHOTOMASK

BACKGROUND OF THE INVENTION (1) Field of the Invention

The present invention relates to a photomask used in the production of a density integrated circuit such as an LSI, blanks for the photomask for the production of the photomask and a method for forming a pattern by using the halftone phase shifting photomask, and in particular the invention relates to a halftone phase shifting photomask by which a projected image having fine dimensions can be obtained, blanks for the halftone phase shifting photomask for the production of the halftone phase shifting photomask and a method for forming the pattern by using the halftone phase shifting photomask.

(2) Description of the Prior Art

Semiconductor integrated circuits such as an LST are produced by repeating the so-called lithographic process in which-a photomask is used. Particularly, for the formation of products having fine dimensions, the use of a phase shifting photomask such as that described for example in Japanese Patent Laid-Open No. 173744 of 1983 (Showa 58), Japanese Patent Publication No. 59296 of 1987 (Showa 62) and others are studied. Especially, the so-called halftone phase shifting photomask such as that described for example in U.S. Pat. No. 4,890,309 attracted the attention of people from a viewpoint of early practical application. Some proposals are made as to the improvement in yield and the structure and material that result in a decrease in cost which proposals are described in Japanese Patent Laid-Open No. 2259 of 1993 (Heisei 5), Japanese Patent Laid-Open No. 127361 of 1993 (Heisei 5) and others, and making such proposals practicable is proceeding.

A halftone phase shifting photomask is explained briefly referring to figures. FIG. 1 comprises explanatory views showing the principle of halftone phase shifting lithography. FIG. 2 comprises explanatory views showing a conventional method. FIG. 1(a) and FIG. 2(a) are each a sectional view of a photomask, respectively. FIG. 1(b) and FIG. 2(b) show the amplitude of light on the photomask, respectively. FIG. 1(c) and FIG. 2(c) show the amplitude of light on a wafer, respectively. FIG. 1(d) and FIG. 2(d) show the strength of light on the wafer, respectively. Numerals 11 and 21 (FIG. 1(a)) designate a transparent substrate. Numeral 22 FIG. 2(a)) designates 100% lightproof film. Numeral 12 designates a halftone phase shifting film. Numerals 13 and 23 designate incident rays. Halftone phase shifting film is a film having the function that the phase of applied rays which have passed through the film is inverted in fact against the phase of applied rays passing through air with the same length of light paths and the optical strength of the former is attenuated against the optical strength of the latter, which is formed of a layer or multiple layers. In a conventional method, as shown in FIG. 2(a), 100% lightproof film 22 made of chromium and others is formed on substrate 21 made of quartz glass and others, by which a light-transmitting area having a desired pattern is only formed, wherein as shown in FIG. 2(d), the distribution of optical strength shows the spread of edges so that the resolution is decreased. On the contrary, in the halftone phase shifting lithography, since the phase of rays which have transmitted through halftone phase shifting film 12 of semitransparent film is inverted in fact against phase of rays which have passed through openings of the halftone phase shifting film 12, as shown in FIG. 1(d), the optical strength in the border of the pattern formed on the halftone phase shifting photomask becomes 0 on the wafer so that the spreading of both edges is suppressed, therefore the solution being improved.

Special attention should be paid to that in order to obtain the effect of halftone phase shifting photomask, the phase angle and the transmittance of halftone phase shifting film become very important, adding to various characters such as the dimensional tolerances, the positional tolerances and others of pattern formed on the photomask which are requested to a conventional photomask, and further that the phase angle and transmittance are determined according to refractive index, coefficient of extinction in the wavelength of the applied rays and the thickness of film of a layer or multiple layers forming the halftone phase shifting film.

Generally, the most suitable value for the phase angle is 180°. However, the most suitable value for the transmittance is in the region of 1 through 20% supposing the transmittance in the opening area of halftone phase shifting film is 100%, which is determined according to the pattern to be transferred, transferring conditions and others. As to the halftone phase shifting photomask, it is requested to set the phase angle and the transmittance to the most suitable values thereof. When values of them deviate from the most suitable value, a proper quantity of the change of applied rays appears, which results in the lowering of the dimensional tolerance, and the lowering of the focal latitude or allowable extent and others. Accordingly, refractive index, coefficient of extinction, the accuracy of the thickness of film and stability are important needless to say. FIGS. 3 and, 4 show the results of simulation made about the effect of transmittance change and phase difference change in the lithography using halftone phase shifting photomask on a change of focal depth, transferring length and best focus.

Together with a miniaturizing pattern to be formed, it is needed to shorten the wavelength of rays used in lithography. As the miniaturization over the so-called 2.5 micron design rule proceeds, the practical application of a KrF excimer laser (wavelength: 248 nm) starts, and further the length of pattern is miniaturized. In consideration of the above-mentioned conditions, the use of ArF excimer laser is studied. As to a halftone phase shifting film used in a halftone shifting photomask, the development of material is requested which enables the most suitable phase angle and transmittance to also be realized for these wavelengths and has the stable refractive index and coefficient of extinction.

Accordingly, it was proposed to use film containing mainly chromium and including fluorine as disclosed in Japanese Patent Laid-Open No. 110572 of 1995 (Heisei 7) as halftone phase shifting film. This film enables the range of values of suitable phase angle and transmittance against the above-mentioned wavelength to be realized. Further, this film has the advantage of the production of blanks, the manufacturing process of the mask and others being possible in the same manner as these of conventional photomasks. Therefore, the investigation of this film was begun from the early stage, and practical application was made.

However, the halftone phase shifting film containing mainly chromium and including fluorine has a problem that by applying rays used in the application of rays such as ArF excimer laser, over a long time, the refractive index, and coefficient of extinction, or any of the two of the halftone phase shifting film change(s). Therefore, in the case of forming a resist pattern using the halftone phase shifting photomask having the halftone phase-pattern film that contains mainly chromium and includes fluorine, the refractive index and phase angle, or any of the two, changes over time as the halftone phase shifting photomask is used.

In this case, as is evident from the result of a simulation shown in FIGS. 3 and 4, even if the phase difference and transmittance slightly change, focusing position, and latitude as well as transferring length change greatly. Namely, these changes result in the possibilities that a proper quantity of the change of applied rays, the lowering of dimensional tolerance and the lowering of focal latitude appear every time a photomask is used, and that even in one usage of photomask, these change, which results in a decrease in latitude of pattern forming and the worsening of the shape of pattern.

BRIEF SUMMARY OF THE INVENTION

Accordingly, it is an object of the present invention to provide blanks for a halftone phase shifting photomask used for the production of the halftone phase shifting photomask in which transmittance change and phase angle change do not appear even if an excimer laser for expose is applied to the photomask for a long time.

It is a second object of the present invention to provide a halftone phase shifting photomask in which transmittance change and phase angle change do not appear even if the excimer laser for expose is applied to the photomask for a long time.

It is a third object of the present invention to provide a method of forming a pattern using the blanks for the halftone phase shifting photomask.

A first type of blanks for a halftone phase shifting photomask according to the present invention comprises a halftone phase shifting film including at least chromium and fluorine on a transparent substrate, in which heat treatment is given to the halftone phase shifting film, by which a change of optical characteristic of the halftone phase shifting film appearing in applying the excimer laser for exposure to the halftone phase shifting film is decreased.

A second type of blanks for the halftone phase shifting photomask according to the present invention comprises a halftone phase shifting film including at least chromium and fluorine on a transparent substrate, in which a protective film is provided on the heat-treated halftone phase shifting film, by which a change of optical characteristic of the halftone phase shifting film appearing in applying the excimer laser for exposure to the halftone phase shifting film is decreased.

A third type of blanks for the halftone phase shifting photomask according to the present invention comprises a halftone phase shifting film including at least chromium and fluorine on a transparent substrate, in which the surface layer of the heat-treated halftone phase shifting is removed by etching the surface, by which a change of optical characteristic of the halftone phase shifting film appearing in applying the excimer laser for exposure to the halftone phase shifting film is decreased, and the transmittance thereof is increased.

In the first type of blanks for the halftone phase shifting photomask, it is desirable that an interface disappears from the inside of the halftone phase shifting film by the heat treatment of the halftone phase shifting film.

In the second type of blanks for the halftone phase shifting photomask, it is desirable that the protective film includes at least chromium and fluorine, and the content of fluorine contained in the protective film is lower than the content of fluorine contained in the halftone phase shifting film. Further, it is desired that the protective film is a transparent film.

A first type of halftone phase shifting photomask according to the present invention comprises a pattern of halftone phase shifting film including at least chromium and fluorine on a transparent substrate, in which heat treatment is given to the halftone phase shifting film, by which a change of optical characteristic of the halftone phase shifting film appearing in applying the excimer laser for exposure to the halftone phase shifting film is decreased.

A second type of halftone phase shifting photomask according to the present invention comprises a pattern of halftone phase shifting film including at least chromium and fluorine on a transparent substrate, in which after the halftone phase shifting film has been formed into a desired pattern, the halftone phase shifting film is heat-treated, by which a change of optical characteristic of the halftone phase shifting film appearing in applying the excimer laser for exposure to the halftone phase shifting film is decreased.

A third type of halftone phase shifting photomask according to the present invention comprises a pattern of halftone phase shifting film including at least chromium and fluorine on a transparent substrate, in which a protective layer is provided on the pattern of halftone phase shifting film, by which a change of optical characteristic of the halftone phase shifting film appearing in applying the excimer laser for exposure to the halftone phase shifting film is decreased.

A fourth type of halftone phase shifting photomask. According to the present invention comprises a pattern of halftone phase shifting film including at least chromium and fluorine on a transparent substrate, in which after the halftone phase shifting film has been formed into a desired pattern, a protective layer is provided on the whole surface of the photomask, by which a change of optical characteristic of the halftone phase shifting film appearing in applying the excimer laser for exposure to the halftone phase shifting film is decreased.

In the first type of halftone phase shifting photomask, it is desired that after heat-treating the halftone phase shifting photomask, a protective film is provided on the heat-treated halftone-shifting film, thereafter the protective film and the halftone phase shifting film are formed into a desired pattern, by which a change of optical characteristic of the halftone phase shifting film appearing in applying the excimer laser for exposure to the halftone phase shifting film is decreased.

Further, in the first type of halftone phase shifting photomask, it is desired that after heat-treating the halftone phase shifting film, the heat-treated halftone phase shifting film is formed into a desired pattern, thereafter a protective film is provided on the whole substrate, by which a change of optical characteristic of the halftone phase shifting film appearing in applying the excimer laser for exposure to the halftone phase shifting film is decreased.

In the second type of halftone phase shifting photomask, it is desired that after heat-treating the halftone phase shifting film formed into a desired pattern, a protective film is provided on the whole surface of the photomask, by which a change of optical characteristic of the halftone phase shifting film appearing in applying the excimer laser for exposure to the halftone phase shifting film is decreased.

In the first and second types of halftone phase shifting photomasks, it is desired that by heat-treating the halftone phase shifting film, the interface disappears in the inside of the halftone phase shifting film by heat-treating the halftone phase shifting film.

In the third and fourth types of halftone phase shifting masks, it is desired that a protective film includes at least chromium and fluorine, and the content of fluorine contained in the protective film is lower than the content of fluorine contained in the halftone phase shifting film. Further, it is desired that the protective film is transparent.

Further, in any of the above-mentioned halftone phase shifting photomasks, it is also desired that when forming a pattern, a size of the pattern is made smaller than the desired size.

Further, the present invention comprises a method of forming a pattern which includes a method of forming a pattern using the above-mentioned halftone phase shifting photomask.

BRIEF DESCRIPTION OF THE DRAWINGS

FIGS. 7(a) and 7(b) are graphical views showing that the spectrum analyzed from reflectance of X-rays (after Fourier transform) is changed by applying an excimer laser to a halftone phase shifting photomask having the halftone phase shifting film containing chromium and fluorine, in which FIG. 7(a) shows the spectrum analyzed from reflectance of X-rays before the applying of an excimer laser to the halftone phase shifting photomask, and FIG. 7(b) shows the spectrum analyzed from reflectance of X-rays of after the applying of the excimer laser to the halftone phase shifting photomask.

DETAILED DESCRIPTION

Figure 1:
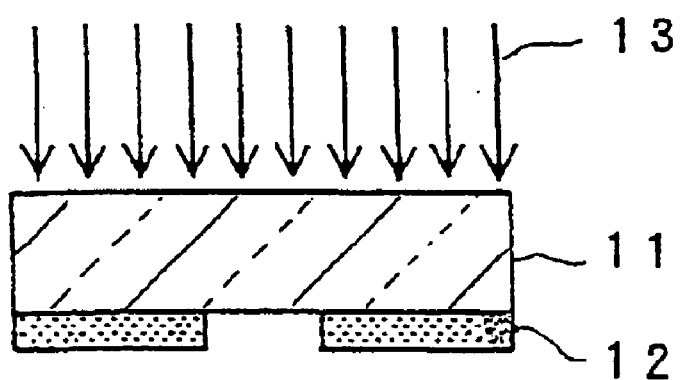
FIGS. 1(a), 1(b), 1(c) and 1(d) are diagrammatic views showing the principle of halftone phase shifting lithography.
Figure 1:
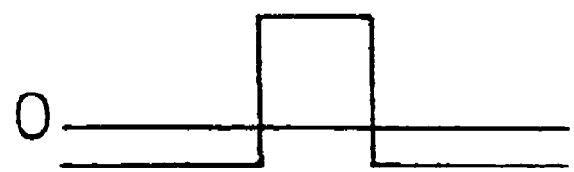
Figure 1:
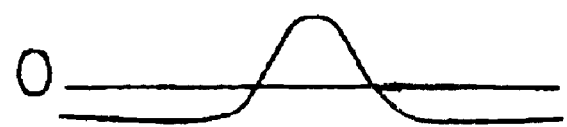
Figure 1:
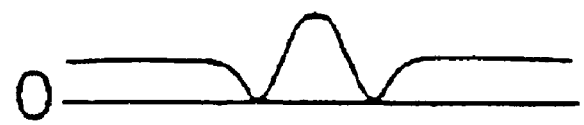
Figure 2:
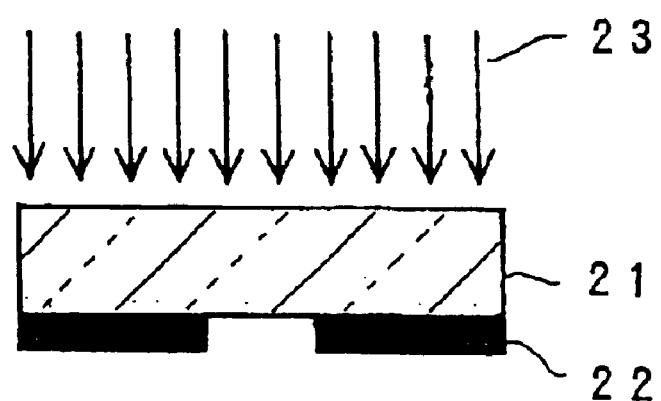
FIGS. 2(a), 2(b), 2(c) and 2(d) are diagrammatic views showing conventional lithography against FIG. 1.
Figure 2:
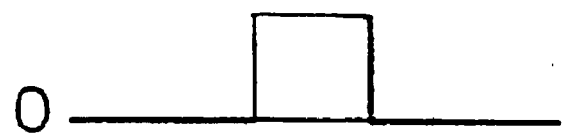
Figure 2:
Figure 2:
Figure 3:
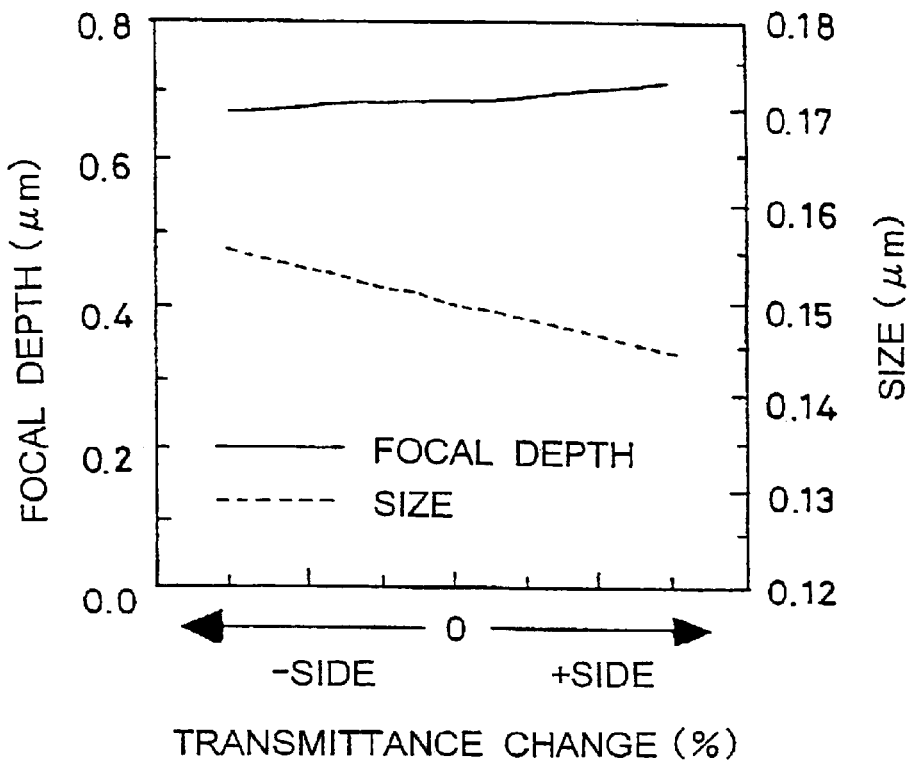
FIG. 3 is a graphical view showing that focal depth and transferring length are affected by a phase difference change in the lithography in which a halftone phase shifting photomask is used.
Figure 4:
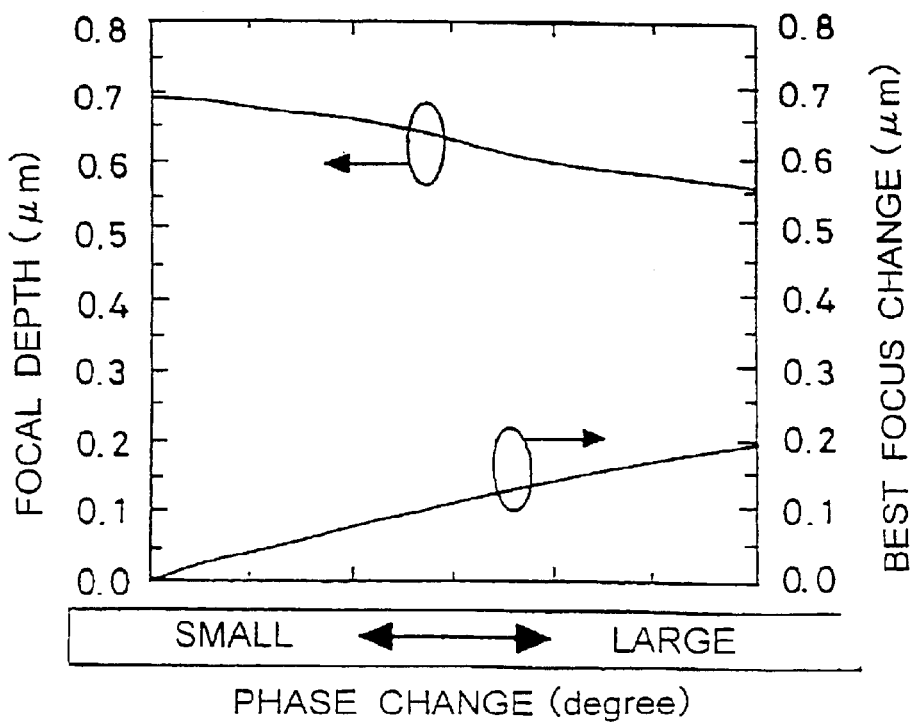
FIG. 4 is a graphical view showing that focal depth and best focus change are affected by a change of phase difference change, in the lithography in which a halftone phase shifting photomask is used.

In the present invention, for blanks for a halftone phase shifting photomask having a halftone phase shifting film including at least chromium and fluorine on a transparent substrate, a change of optical property of the halftone phase shifting film that is produced when applying an excimer laser to the halftone phase shifting film is decreased by treating the halftone phase shifting film with heat at a temperature of between 250° C. and 500° C.

Further, in the present invention, for blanks for a halftone phase shifting photomask having a halftone phase shifting film including at least chromium and fluorine on a transparent substrate, a change of optical property of the halftone phase shifting film that is produced in applying an excimer laser to the halftone phase shifting film is decreased, and the transmittance of the halftone phase shifting film is increased, by treating the halftone phase shifting film with heat at a temperature of between 250° C. and 500° C., and then removing the surface of the heat-treated film by etching the surface.

Further, in the present invention, for blanks for a halftone phase shifting photomask having a halftone phase shifting film including at least chromium and fluorine on a transparent substrate, a change of optical property of the halftone phase shifting film that is produced in applying an excimer laser to the halftone phase shifting film is decreased, and the transmittance of the halftone phase shifting film is increased, by treating the halftone phase shifting film with heat at a temperature of between 250° C. and 500° C., then removing the surface of the heat-treated film by etching the surface, and thereafter coating the halftone phase shifting film with a protective film.

Further, in the present invention, for blanks for a halftone phase shifting photomask having a halftone phase shifting film including at least chromium and fluorine on a transparent substrate, a change of optical property of the halftone phase shifting film that is produced in applying excimer laser to the halftone phase shifting film is decreased, by coating the halftone phase shifting film with a protective film, and thereafter treating the halftone phase shifting film having the protective film with heat at a temperature of between 250° C. and 500° C.

Further, in the present invention, as to blanks for a halftone phase shifting photomask having a halftone phase shifting film including at least chromium and fluorine on a transparent substrate, a change of optical property of the halftone phase shifting film that is produced in applying an excimer laser to the halftone phase shifting film is decreased, and the transmittance of the halftone phase shifting film is increased, by coating the halftone phase shifting film with a protective film, then treating the halftone phase shifting film with heat at a temperature of between 250° C. and 500° C., and thereafter removing the surface of the heat-treated film by etching the surface.

In the above-mentioned blanks for the halftone phase shifting photomask, it is desirable that the surface of the halftone phase shifting film which has been heat-treated contains at least chromium and the content of fluorine contained in the surface thereof is lesser than that contained in the inside thereof.

Further, in the above-mentioned blanks for the halftone phase shifting photomask, it is desirable that the protective film contains at least chromium, and the content of fluorine contained in the protective film is lesser than that contained in the halftone phase shifting film.

Further, in the above-mentioned blanks for the halftone phase shifting photomask, it is desirable that the interface existing in the halftone phase shifting film disappears by the above-mentioned heat-treatment.

Blanks for a halftone phase shifting photomask of the present invention are produced by using the above-mentioned blanks for halftone phase shifting photomask, in which the halftone phase shifting photomask can be obtained by making patterning of the halftone phase shifting film after the above-mentioned treatment In the present invention, for a halftone phase shifting photomask having a halftone phase shifting film including at least chromium and fluorine on a transparent substrate, a change of optical property of the halftone phase shifting film that is produced in applying an excimer laser to the halftone phase shifting film is decreased, by treating the halftone phase shifting film with heat at a temperature of between 250° C. and 500° C., then by forming the heat-treated halftone phase shifting film into a pattern, and thereafter forming a protective film on the whole surface of the halftone phase shifting film.

Further, in the present invention, for a halftone phase shifting photomask having a halftone phase shifting film including at least chromium and fluorine on a transparent substrate, the halftone phase shifting film is treated with heat at a temperature of between 250° C. and 500° C., and then the surface of heat-treated film is removed by etching the surface such that the halftone phase shifting film is formed into a pattern. Thereafter, a protective film is formed on the whole surface of the halftone phase shifting photomask, by which a change of optical property of the halftone phase shifting film that is produced in applying an excimer laser to the halftone phase shifting film is decreased, and the transmittance of halftone phase shifting film is increased.

Further, in the present invention, in a halftone phase shifting photomask having a halftone phase shifting film including at least chromium and fluorine on a transparent substrate, a change of optical property of the halftone phase shifting film that is produced in applying an excimer laser to the halftone phase shifting film is decreased, and the transmittance of halftone phase shifting film is increased by making patterning of the halftone phase shifting film, and then treating the halftone phase shifting film with heat at a temperature of between 250° C. and 500° C.

Further, in the present invention, in a halftone phase shifting photomask having a halftone phase shifting film including at least chromium and fluorine on a transparent substrate, a change of optical property of the halftone phase shifting film that is produced in applying an excimer laser to the halftone phase shifting film is decreased, and of the transmittance of the halftone phase shifting film is produced, by making patterning of the halftone phase shifting film, then treating the halftone phase shifting film with heat at a temperature of between 250° C. and 500° C. and removing the surface of the heat-treated halftone phase shifting film.

Further, in the present invention, for a halftone phase shifting photomask having a halftone phase shifting film including at least chromium and fluorine on a transparent substrate, a change of optical property of the halftone phase shifting film that is produced in applying an excimer laser to the halftone phase shifting film is decreased, and the transmittance of halftone phase shifting film is increased by making patterning of the halftone phase shifting film, then treating the halftone phase shifting film with heat at a temperature of between 250° C. and 500° C. and removing the surface of film by etching the surface, to form a protective film on the whole surface of halftone phase shifting photomask.

In the above-mentioned photomask, it is desirable that the surface of the protective film contains at least chromium and that the content of fluorine contained in the protective film is lesser than that contained in the halftone phase shifting film.

Further, in the above-mentioned halftone phase shifting photomask, it is desirable that the protective film is transparent.

Further, in the above-mentioned halftone phase shifting photomask, it is desirable that the interface existing in the halftone phase shifting film disappears by the above-mentioned heat-treatment.

Further, in the above-mentioned halftone phase shifting photomask, it is desirable that when forming the pattern, a size of the pattern is made smaller than the desired size.

Then, the reason why the above-mentioned construction is employed in the present invention is explained.

Figure 5:
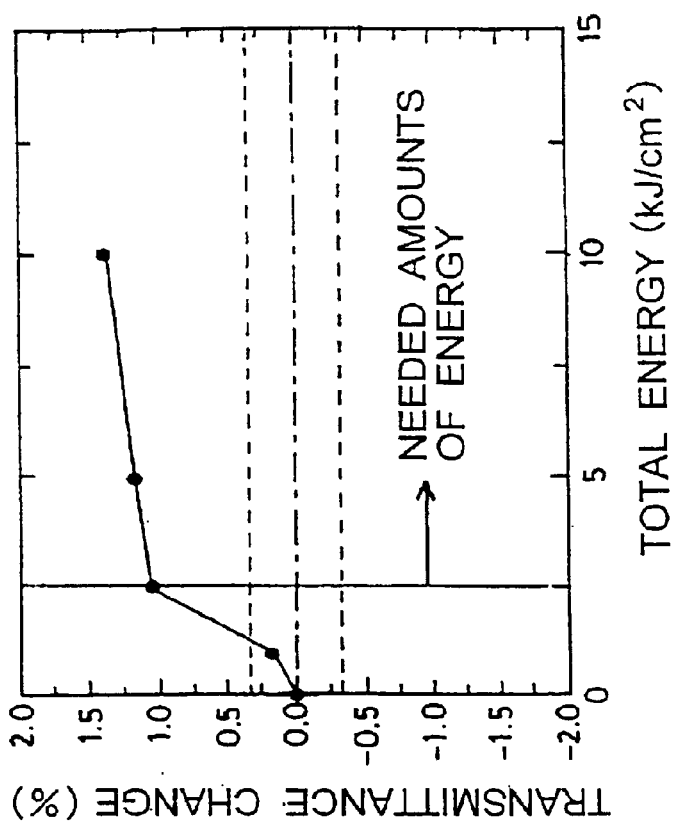
FIGS. 5(a) and 5(b) are graphical views showing a state in which phase difference and transmittance are changed by applying an excimer laser to a halftone phase shifting photomask having the halftone phase shifting film containing chromium and fluorine.
Figure 5:
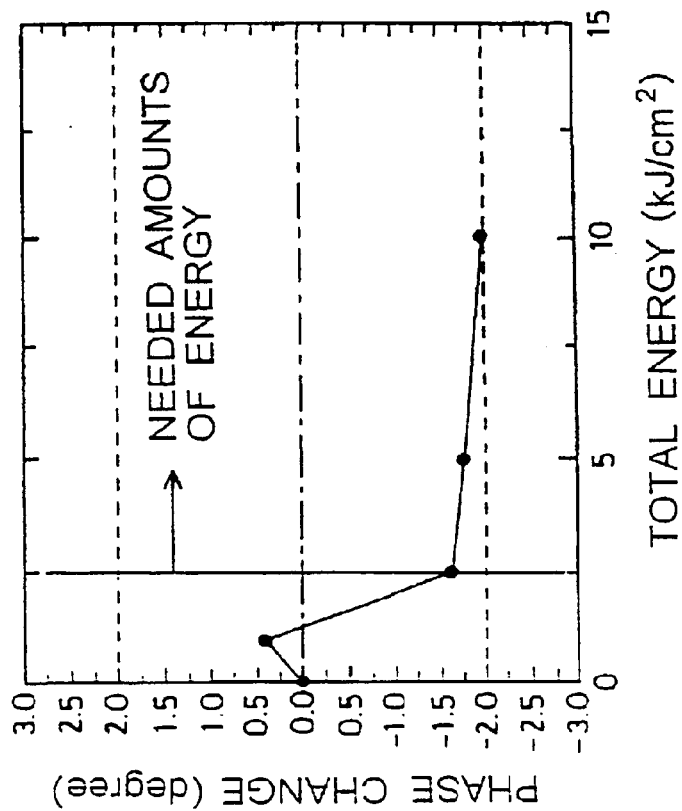
Figure 6:
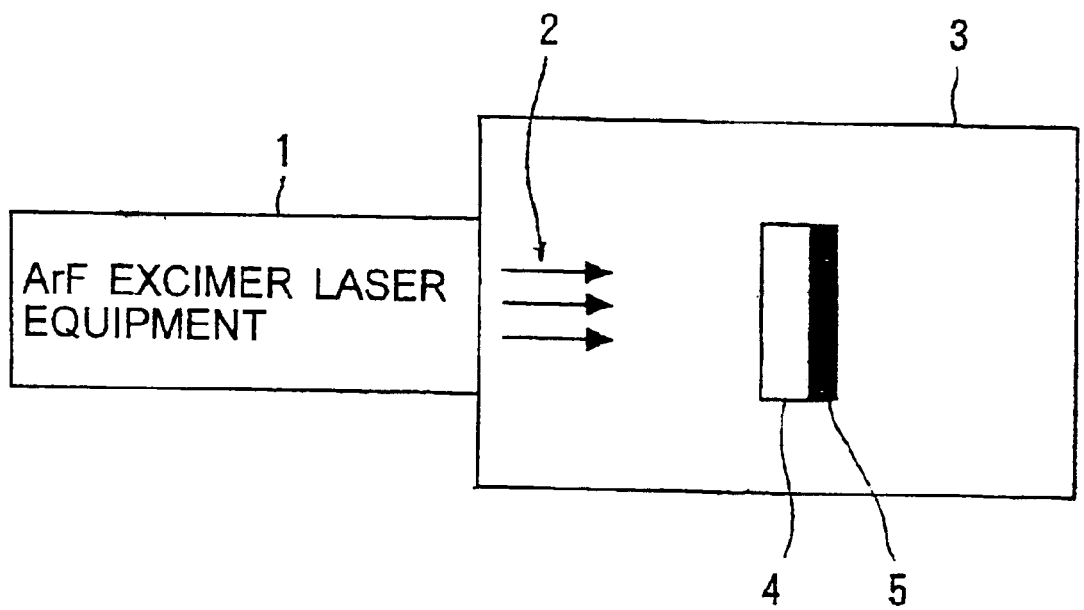
FIG. 6 is a brief view of an irradiation device.

FIGS. 5(a), (b) show a state in which phase difference and transmittance are changed by applying an excimer laser to a halftone phase shifting photomask having the halftone phase shifting film containing chromium and fluorine, in which phase difference change and transmittance change of the halftone phase shifting film against total amount of irradiated energy is shown, in the case wherein an irradiation device 1 shown in FIG. 6 was used, in which an ArF excimer laser beam 2 (thereafter, it is called briefly "laser") was applied to the halftone phase shifting film 5 from the side of glass substrate 4 disposed in a sample chamber 3 on the condition that pulse energy is 0.2 mJ/cm$^2$ /pulse, repeated frequency is 1 kHz, and atmosphere of irradiation is the atmosphere, wherein measurement of phase difference and transmittance was made by means of "MPM193 phase difference measuring instrument" manufactured by LSER TECK Co.

In order to investigate the cause of phase angle change and transmittance change of the halftone phase shifting film containing at least chromium and fluorine being produced according to the above-mentioned application of ArF excimer laser, the compositions of the above-mentioned halftone phase shifting film before and after applying irradiated rays to the halftone phase shifting film were analyzed by the X-ray photoelectron spectroscopy (XPS). The result of analysis is shown in Table 1. The numerical-values shown in Table 1 show ratio (%) of atoms existing in the halftone phase shifting film, wherein irradiation of ArF excimer laser to the halftone phase shifting film is made on the condition that pulse energy is 0.2 mJ/cm$^2$ /pulse, repeated frequency was 1 kHz, and atmosphere of irradiation was the atmosphere. X-ray photoelectron spectroscopy was made using "ESCALAB210" manufactured by VG SCIENTIFIC CO. As to measurement of the composition of the halftone phase shifting film of the inside of it, halftone etching of the halftone phase shifting film was made by Ar ion beam, then the analysis thereof was made.

TABLE 1

|  |  | Cr | F | C | O |
|---|---|---|---|---|---|
| The surface of Film | Before exposure | 14 | 27 | 31 | 28 |
|  | After exposure | 14 | 17 | 34 | 35 |
| The inside of Film | Before exposure | 25 | 55 | 10 | 10 |
|  | After exposure | 25 | 55 | 10 | 10 |

As is apparent herein, a great change of the composition of the halftone phase shifting film produced by applying ArF excimer laser to the halftone phase shifting film is not found inside the film, while a change of nature of the film is found in the surface of the film in that the amount of fluorine is decreased, and the amount of oxygen is increased.

Figure 7:
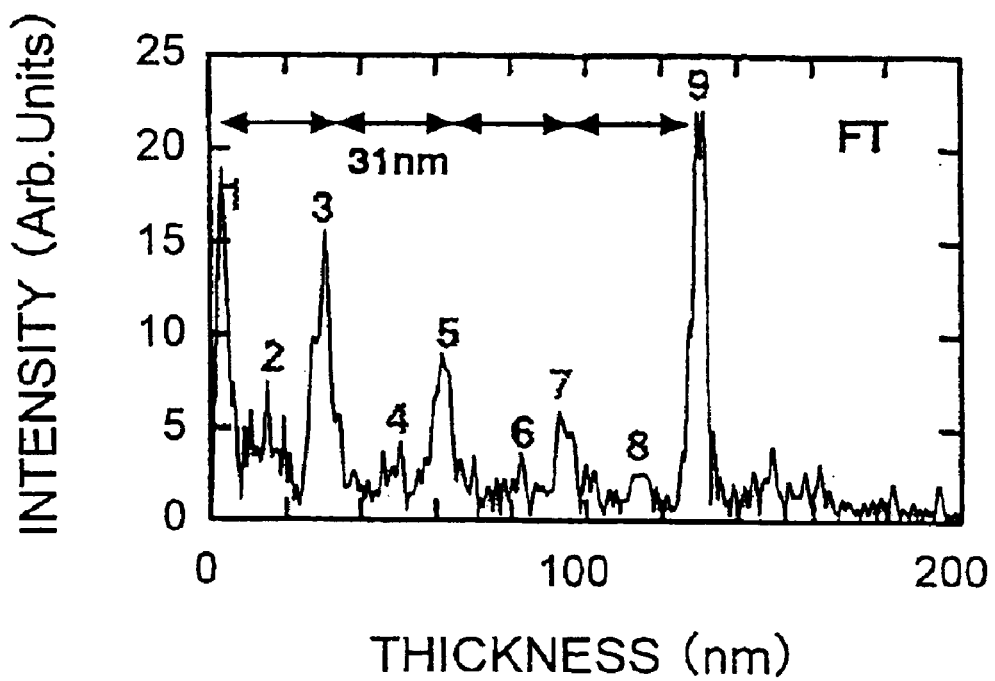
Figure 7:
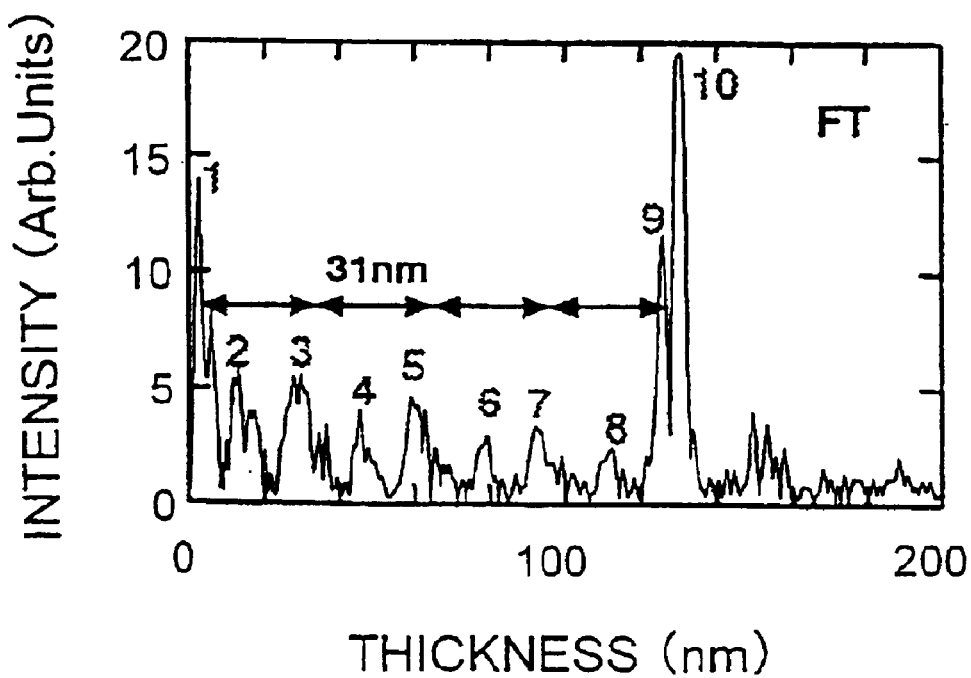

Further, FIG. 7 shows the result obtained by analyzing the structure of the halftone phase shifting film before and after applying rays to the film from X-ray reflectance. In spectrum which has been Fourier-transformed, sharp peaks appear with a distance of 31 nm before applying rays to the film, which shows that the halftone phase shifting film is composed of four layers having the film thickness of 31 nm, respectively. The structure of a film that is composed of layers is caused by the forming of the film wherein the process of forming of the film is divided into four. After applying rays to the film, these peaks are weakened, which shows that atoms move by applying rays to the film, which results in the disappearance of the interface of film.

When the interface exists in a film, any incident rays are reflected from the interface. As the number of the interfaces is increased, the ratio of reflected light from the interfaces is increased, while the amount of transmitting light is decreased. The above-mentioned disappearance of the interface gets rid of the reflection of light from the interface, so that the transmittance of the halftone phase shifting film is increased. Namely, it is thought that the main cause of the above-mentioned phase difference change and transmittance change produced according to the application of rays to the film is the disappearance of the interface.

On the other hand, it is thought that a decrease in the amount of fluorine in the surface of the film produces the decrease in the transmittance of the film. It is thought that the above-mentioned phase difference change and transmittance change produced by rays applied to the film include the phase difference change and transmittance change caused by a change of the nature of film. However, since such phase difference change and transmittance change are the reverse of the phase difference change and transmittance change caused by the reflection of rays from the interface, these changes are not found in FIG. 5.

Accordingly, in the present invention, in a halftone phase shifting photomask having a halftone phase shifting film containing at least chromium and fluorine, before the photomask is used for the exposure, heat-treatment is made to the halftone phase shifting photomask in such a manner that atoms included in the film are dispersed so that the interface between layers disappears. Further, since the heat treatment makes fluorine contained in the surface of film evaporate to decrease the transmittance, in order to prevent this, the surface of the film in which fluorine has been evaporated is removed by etching the surface, by which the transmittance of film is adjusted to an amount needed essentially.

When fluorine is evaporated from the surface of film by the above-mentioned heat treatment so that the concentration of fluorine contained in the surface of film is kept to a suitable amount, the surface of the film changes into a natural protective film formed naturally by the heat treatment. The natural protective film shows the effect that the phase difference change and the transmittance change of the film are controlled.

Then, further, the present invention can take a form in which a protective film for preventing the change of the above-mentioned nature of the film is provided on the surface of halftone phase shifting film. When the amount of fluorine contained in the surface of film is much, as in the surface of film after the surface of film has been etched, as shown in FIG. 1, the nature of the film in the neighborhood of the surface of the film is changed according to the nature of the surface of film. By providing such a structure for preventing a change of the nature of the film peculiar to the film portion near the surface of the film, phase angle change and transmittance change produced by applying rays to the film laser according to applying can be controlled to the normal transmittance in the same manner as the above-mentioned case.

In order to omit the process of etching the film surface, a halftone phase shifting film can be deposited in such a manner that the concentration of fluorine contained in the halftone phase shifting film becomes higher, so that the defined transmittance as well as the amount of fluorine can be controlled after heat-treating the film.

As to the protective film, transparent films against rays applied to films such as $SiO2$ film are desirable. In these films, a change in the surface shown in Table 1 is not only produced, but also plays a role as the protective film with which a change of quality in which the amount of fluorine is decreased as above-mentioned and the amount of oxygen is increased is prevented. Accordingly, the phase difference change and the transmittance change of the halftone phase shifting photomask produced by applying of rays to the film can be prevented.

There are given as protective films transparent films as $MgF2$, $CaF2$, $LiF2$, $Al2O3$, $TiO2$, $ZrO2$, $HfO2$, $Ta2O5$, $ZnO$, $MgO$, and $W2O5$ in addition to the above-mentioned metal oxide $SiO2$. As to these transparent films, if the halftone phase shifting film has been deposited on a transparent substrate, the desired effect can be obtained, even if the transparent films are deposited in any process in the producing process of the photomask.

Further, the transparent film may be rays-semitransparent to irradiated rays. In this case, it is desirable that semitransparent film is deposited before forming photomask blanks into desired patterns, wherein the semitransparent protective film is formed into the same patterns as that of the halftone phase shifting film at the same time in forming the halftone phase shifting film into the desired pattern or in another process.

However, anyway, halftone phase shifting film in these cases should be deposited in such a manner that the desired relation on the transmittance and phase difference between opened areas and patterned areas of the halftone phase shifting is formed. Further, when it is expected that protective film is deposited on the cross section of parts of halftone phase shifting film having patterns, in such a case as a protective film is formed after the desired pattern was made beforehand. It is considered that a change of size of transferred pattern to resist is caused by depositing of protective film on the cross section of the halftone phase shifting film. It is desirable to form a pattern adding the change of pattern caused by depositing of protective film on the cross section of halftone phase shifting film.

Further, in a case where the halftone phase shifting film including at least chromium and fluorine is formed into a multilayer film, it is effective that a film in which a change of the property of the surface of film by applying rays to the surface of film is hard to be produced. In this case, in case of the film containing at least chromium and fluorine, since a phenomenon, such as the amount of fluorine is decreased and the amount of oxygen is increased, occurs intensively, as the content of fluorine increase. Therefore, in this case, it is desirable to dispose a film having a small amount of fluorine.

Finally, each of the heat-treatment and the forming of protective film shows a sufficient effect for suppressing a change in transmittance or phase angle of the halftone phase shifting film containing at least chromium and fluorine produced by the application of ArF excimer laser to the film, independently, as above-mentioned. However, both the heat-treatment and the forming of protective film can be applied. In this case, even if which of the heat-treatment and the forming of protective film is made first, difference in the effect thereof cannot be found. Further, respective treatment can be made in any process in the manufacturing process of photomask.

In such a way, the transmittance and the phase difference, according to the present invention, can be stabilized against the application of ArF excimer laser and other to the halftone phase shifting film by making the interface disappear by the heat-treatment for the halftone phase shifting photomask having halftone phase shifting film containing at least chromium and fluorine disposed on a transparent substrate.

Further, for the halftone phase shifting photomask, the protective film on the surface of halftone phase shifting film prevents a change of the property of the surface of the film from being produced by the application of ArF excimer laser and others to the film, so that the transmittance and phase difference can be stabilized.

Modifying of the halftone phase shifting film or the forming of protective film reduces in transmittance change and phase angle change arisen in storage of photomask, or under usage, wherein the problem is solved and reduced that the suitable amount of rays is changed, the accuracy of size is lowered, and the focal latitude is decreased, so that the shape of pattern is worsened, every time a photomask is used.

EXAMPLE 1

Figure 8:
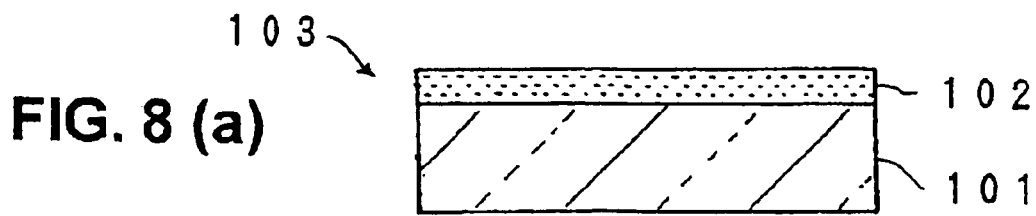
FIGS. 8(a), 8(b), 8(c), 8(d) and 8(e) are graphical views illustrating the processes in which blanks for a halftone phase shifting photomask are produced and then a halftone phase shifting photomask of Example 1 is obtained by processing the blanks for a halftone phase shifting photomask.
Figure 8:
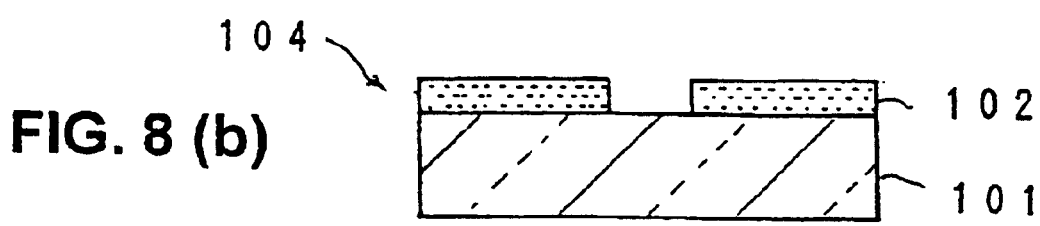
Figure 8:
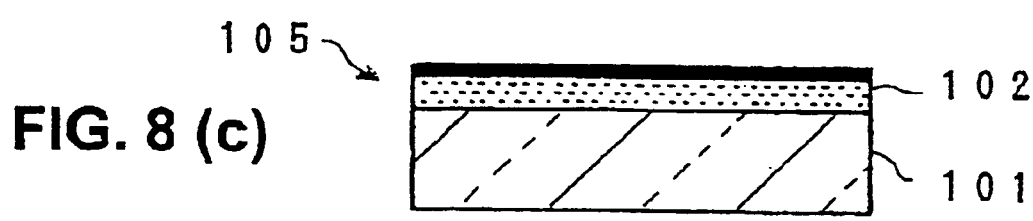
Figure 8:
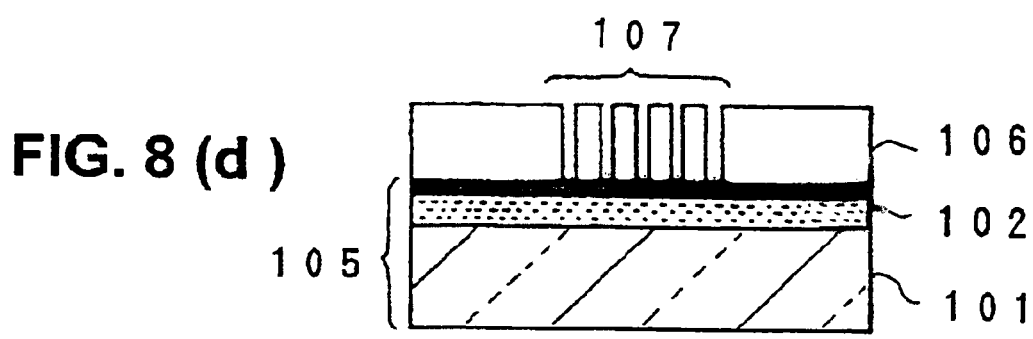
Figure 8:
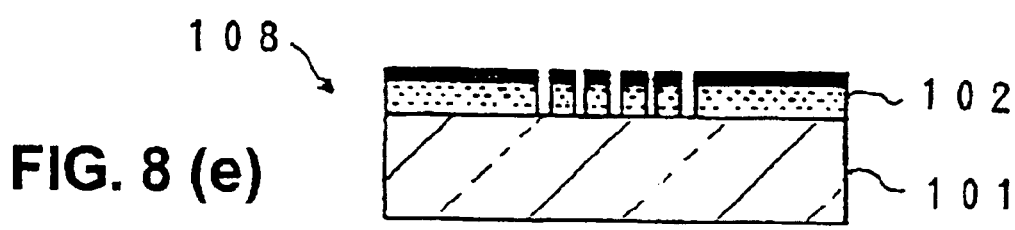

Referring to FIG. 8, an example of blanks for a halftone phase shifting photomask and a halftone phase shifting photomask of the present invention is explained, As shown in FIG. 8(a), a halftone phase shifting film 102 containing chromium and fluorine was formed on a synthetic quartz substrate 101 polished optically and rinsed sufficiently, under the under-mentioned conditions, by which: blanks for halftone phase shifting photomask 103 was obtained, wherein the thickness of the formed halftone phase shifting film 102 was 130 nm.
Conditions:
  Film deposition equipment: DC magnetron sputter equipment
  Target: Metal chromium
  Gas and the flow rate thereof: Argon gas 76 sccm+carbon tetrafluoride gas 245 sccm
  Pressure of sputter: 3.0 mm
  Electric current of sputter: 5.5 ampere
  Halftone phase shifting films 102 having the same thickness were deposited on the same thickness under the same conditions, and the halftone phase shifting films are formed into a pattern by conventional lithography method, by which samples for measurement of phase difference and transmittance 104 were formed, as shown in FIG. 8(b). As a result of measurement of phase difference and transmittance under wave length 193 nm of halftone phase shifting film with the phase contrast meter made by LASER TECK Co., Ltd., "MPM193" put on the market, phase difference of 164, and transmittance of 11% was obtained.

Then, the heat-treatment was given to the blanks 103 for halftone phase shifting photomask, by which as shown in FIG. 8(c), blanks 105 for halftone phase shifting photomask were obtained, in which a change of optical property produced when using a photomask was reduced. Table 2 shows conditions of heat-treatment and the transmittance in wave length 193 nm of after the heat-treatment.

TABLE 2

| Temperature ( ) | Time (Hr) | Atmosphere | Transmittance (%) |
|---|---|---|---|
| 200 | 6 | Air | 11 |
| 300 | 5 | Air | 6 |
| 300 | 5 | $N_2$ | 8 |

Figure 9:
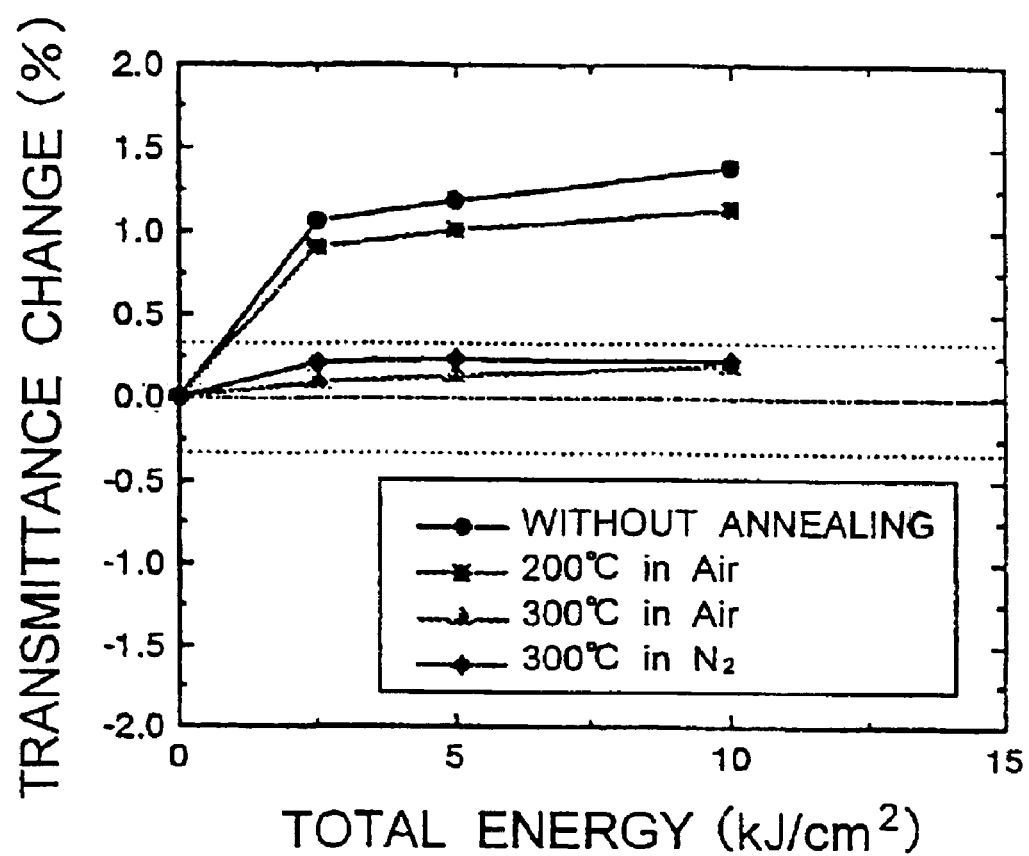
FIG. 9 is a graphical view showing the transmittance change due to applying the excimer laser to a halftone phase. shifting photomask having the halftone phase shifting film of Example 1.

After ArF excimer laser beam of wave length 193 nm was applied to the blanks, the measurement of phase difference and transmittance in wave length 193 nm was measured, under the under-mentioned conditions.
  Light source: ArF excimer
  Irradiation atmosphere: Nitrogen: Oxygen=80: 20
  Pulse energy: 0.2 mJ/cm$^2$/pulse In this time, the irradiation of laser was made from the side of substrate 101. FIG. 9 shows the result of the measurement of phase difference and transmittance. The upper and lower limits of transmittance change were within±03%, wherein the respective values are shown by the dotted lines in FIG. 9. In a case where the heat-treatment is not given to the blanks, transmittance change reaches +1.4% at 10 kJ/cm$^2$ of total irradiation energy. Then, in a case where the heat-treatment was given to the blanks at 200° C., the difference between a case where the heat-treatment is not given to the blanks is not found. However, in a case of the heat-treatment was given to the blanks at 300° C., even in 10 kJ/cm$^2$ of total irradiation energy, transmittance change is within ±0.3%. From this fact, it is seen that a change of optical property is reduced.

It was confirmed that the interface existing in the halftone phase shifting film was made to disappear by the heat-treatment, by the analysis made in the direction of the thickness by XPS. Namely, that the transmittance change of after heat-treatment is small as shown in FIG. 9 is based on the interface being made to disappear by the heat-treatment accompanied with diffusion of atoms.

In the same heat-treatment of 300° C., the difference in transmittance change between the heat-treatment made in air and, the heat-treatment made in Nitrogen atmosphere was not found. However, the difference in the initial transmittance between the two was found. Namely, as shown in Table 2, the difference in the initial transmittance is lowered from 11% to 8% in Nitrogen atmosphere. However, the difference in the initial transmittance is lowered to 8%. Table 3 shows the result of analysis by XPS of after heat-treatment.

TABLE 3

| | | | Cr | F | C | O |
|---|---|---|---|---|---|---|
| 200° C. in Air | The surface of Film | Before Irradiation | 14 | 23 | 23 | 40 |
| | | After Irradiation | 15 | 20 | 18 | 47 |
| | The inside of Film | Before Irradiation | 25 | 55 | 10 | 10 |
| | | After Irradiation | 25 | 55 | 10 | 10 |
| 300° C. in Air | The surface of Film | Before Irradiation | 20 | 0 | 8 | 72 |
| | | After Irradiation | 22 | 0 | 4 | 74 |
| | The inside of Film | Before Irradiation | 25 | 53 | 5 | 17 |
| | | After Irradiation | 25 | 53 | 5 | 17 |
| 300° C. in N$_2$ | The Surface of Film | Before Irradiation | 24 | 2 | 3 | 71 |
| | | After Irradiation | 18 | 2 | 0 | 80 |
| | The Inside of Film | Before Irradiation | 25 | 53 | 5 | 17 |
| | | After Irradiation | 25 | 53 | 5 | 17 |

The composition of the inside of a sample not yet irradiated changes scarcely as compared with that of before annealing (Table 1). However, it was found that when the film is annealed when the film is annealed at 300° C., fluorine was released from the surface of film, while oxygen enters the surface of film. From the estimate about an area from which fluorine is released, it was found that in case of the heat-treatment made at 300° C. in air, fluorine was released from the depth of 30nm from the surface of film. In case of the heat-treatment made in the nitrogen atmosphere, fluorine was released from the depth of 10 nm from the surface of film. Further, the oxidation of the surface took place from the same depth. From this fact, it is found that the lowering of initial transmittance is caused by the amounts of fluorine and oxygen contained in the film, and that as the amount of released fluorine from the film and the extent of the surface oxidized are increased, the initial transmittance is decreased. It is thought that these amounts are determined by amounts of oxygen contained in the atmosphere in which the heat-treatment is made.

It is found that thereafter, blanks for the halftone phase shifting photomask have been heat-treated at 300° C. in such a manner, the optical property of film becomes unchanged even if an ArF excimer laser is applied to the heat-treated. Therefore, in the case where a halftone phase shifting film of the blanks is formed into a pattern to form a photomask, thereafter forming of a pattern to resist is carried out, phase difference change and transmittance change produced in the process of transferring of the pattern are lessened to improve practicability.

Then, a process of processing the blanks for halftone phase shifting photomask into a photomask by forming the halftone phase shifting film into a pattern is explained.

As shown in FIG. 8(d), electric beam resist "ZEP7000" (manufactured by NIHON ZEON Co., Ltd.) was applied on blanks 105 for halftone phase shifting photomask in such a manner that the thickness of film comes to 300 nm after being baked, then was baked at 110° for 20 minutes to obtain electric beam resist film 106. Further, the latent image of a desired pattern was obtained by means of an electric beam writing system for the photomask. Thereafter the halftone phase shifting film was developed by special developing solution ZED 500. Therefore, a desired resist pattern 107 is obtained.

Reactive ion etching was made through the resist pattern 107 as the pattern under the under-mentioned conditions, by which dry etching of halftone phase shifting film 102 was made.

Conditions:
  Etching equipment: Parallel Flat Plate Reactive Ion Etcher
  Gas and the flow rate thereof: dichloromethane 30 sccm+ oxygen 60 sccm
  Pressure of etching: 200 mTorr
  Power of etching: 300 Watt After the completion of etching, any unnecessary part of resist was removed by treating the surface of film by ozone gas while applying ultraviolet rays to the film, so that the halftone phase shifting photomask 108 was obtained as shown in FIG. 8(e).

Since the obtained halftone phase shifting photomask 108 was produced by using blanks for a halftone phase shifting photomask with the stable optical property as shown in FIG. 9, phase difference change and transmittance produced in the process of transferring of pattern were lessened to improve the practicability.

EXAMPLE 2

Figure 10:
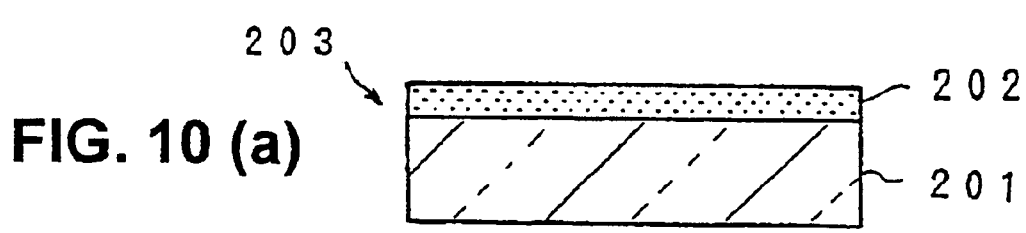
FIGS. 10(a), 10(b), 10(c) and 10(d) are diagrammatic views illustrating the process for producing a halftone phase shifting photomask of Example 2.
Figure 10:
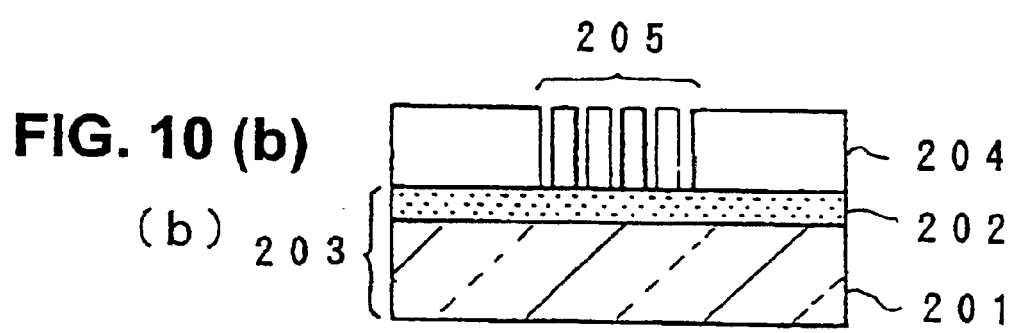
Figure 10:
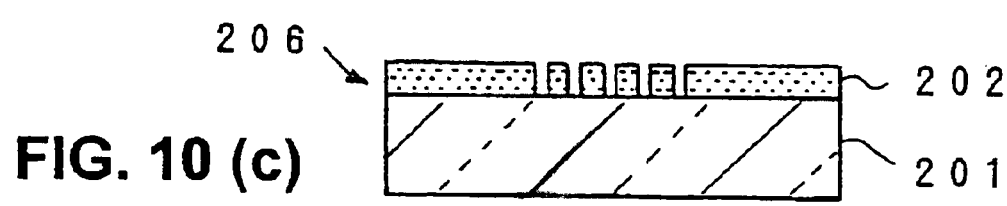
Figure 10:
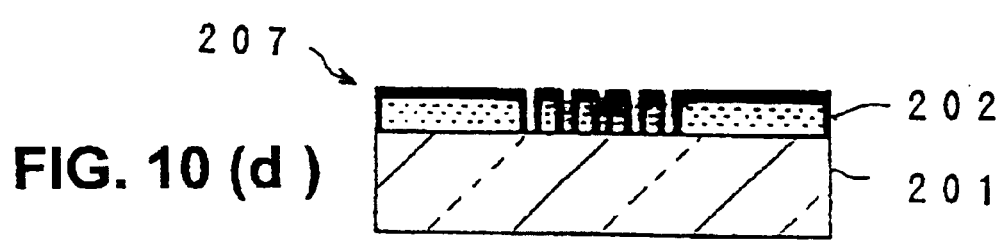

Then, referring to FIG. 10, an example of a halftone phase shifting photomask of the present invention is explained.

As shown in FIG. 10(a), a halftone phase shifting film 202 containing chromium and fluorine was formed on a synthetic quartz substrate 201 polished optically and rinsed sufficiently, in the same sputtering method, as in Example 1, by which blanks 203 for halftone phase shifting photomask was obtained, wherein the thickness of formed halftone phase shifting film 202 was 130 nm.

As shown in FIG. 10(b), electric beam resist "ZEP7000" (manufactured by NIHON ZEON Co., Ltd.) was then applied on blanks 203 for halftone phase shifting photomask in such a manner that the thickness of film comes to 300 nm after being baked, then was baked at 110° C. for 20 minutes to obtain electric beam resist film 204. Further, the latent image of a desired pattern was obtained by means of an electric beam writing system for a photomask, and then the halftone phase shifting film was developed by special developing solution ZED 500 so that a desired resist pattern 205 was obtained.

Reactive ion etching was made through the resist pattern 205 as a pattern under the under-mentioned conditions, by which dry etching of a halftone phase shifting film 202 was made.

Conditions:
  Etching equipment: Parallel Flat Plate Reactive Ion Etcher
  Gas and the flow rate thereof: dichloromethane 30 sccm+ oxygen 60 sccm
  Pressure of etching: 200 mm
  Power of etching: 300 Watt After the completion of etching, any unnecessary part of the resist was removed by treating the surface of the film by ozone gas while applying ultraviolet rays to the halftone phase shifting film, so that halftone phase shifting photomask 208 was obtained as shown in FIG. 10(c).

Then, the halftone phase shifting photomask 206 was rinsed sufficiently, and then the heat-treatment was given to the halftone phase shifting film in the same manner as in Example 1, by which a halftone phase shifting photomask 207 is obtained. Conditions of the heat-treatment were 300° C. and atmosphere was atmosphere in air.

Since the optical property shown in FIG. 5 was made beforehand for the obtained halftone phase shifting photomask 207 to reach the stable area of optical property, phase difference change and transmittance produced in the process of transferring of pattern are lessened to improve the practicability.

EXAMPLE 3

Then, other examples of blanks for halftone phase shifting photomask and halftone phase shifting photomask of the present invention are explained.

A halftone phase shifting film containing chromium and fluorine was formed on a synthetic quartz substrate polished optically and rinsed sufficiently, in the same sputtering method, as in Example 1, wherein the thickness of formed halftone phase shifting film was 160 nm.

The halftone phase shifting film was heat-treated at 300° C. in air, and then the surface of film was removed by plasma etching. Conditions of plasma etching were the same as in Example 3.
Conditions:
 Etching equipment: Parallel Flat Plate Reactive Ion Etcher
 Gas and the flow rate thereof: dichloromethane 30 sccm+ oxygen 60 sccm
 Pressure of etching: 100 mTorr
 Power of etching: 400 Watt The measurement of phase difference and transmittance at wavelength 193 nm in the halftone phase shifting film was made by the phase difference meter for phase shifting photomask "MPM 193 (manufactured by LASER TECK Co., Ltd.) put on the market Phase. The measured value of the phase difference was about 184° and the measured value of transmittance was 12%.

After an ArF excimer laser beam of 193 nm was applied to the blanks for a halftone phase shifting photomask under the under-mentioned conditions, phase difference and transmittance at wavelength 193 nm were measured, wherein conditions of irradiation of laser were the same as in Example 1.

Figure 11:
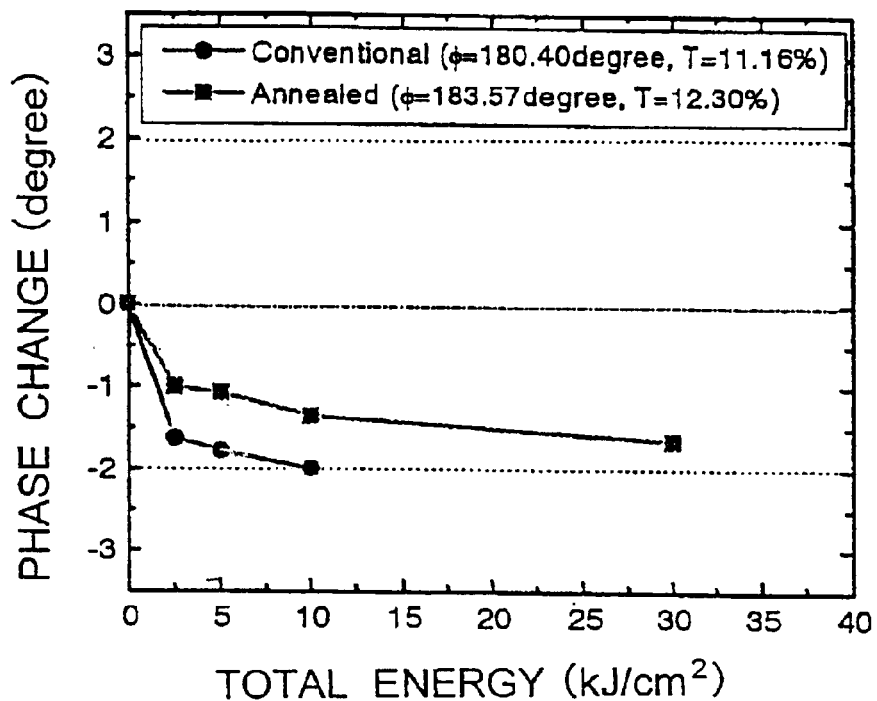
FIGS. 11(a) and 11(b) are graphical views showing the phase difference change and the transmittance change due to applying the excimer laser to a halftone phase shifting photomask having the halftone phase shifting film of Example 1.
Figure 11:
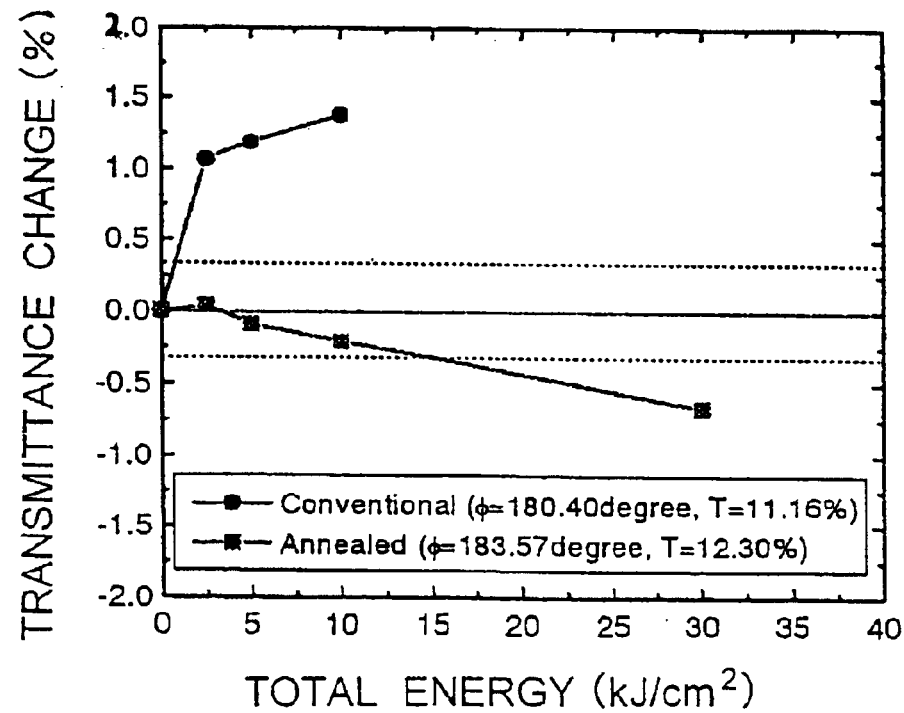

The irradiation of laser was made from the side of substrate. FIGS. 11($a$) and 11($b$) show the results thereof. It is found that phase difference change and transmittance change depending on total amounts of irradiation energy are smaller as compared with these not yet irradiated.

Then, in the same manner as in Example 1, halftone phase shifting film of the blanks for halftone phase shifting photomask was formed into a pattern to produce a photomask.

The obtained halftone phase shifting photomask is shown in FIGS. 11($a$) and 11($b$). Since the production of the halftone phase shifting photomask was carried out using blanks for halftone phase shifting with the stable optical property, phase difference change and transmittance produced in the process of transferring of pattern are lessened to improve the practicability.

EXAMPLE 4

Then, referring to FIG. 10, further examples of blanks for a halftone phase shifting photomask and a halftone phase shifting photomask of the present invention are explained.

A halftone phase shifting film containing chromium and fluorine was formed on a synthetic quartz substrate polished optically and rinsed sufficiently, in the same sputtering method as in Example 1, wherein the thickness of formed halftone phase shifting film was 160 nm.

The halftone phase shifting film was heat-treated at 300° C. in air, and then the surface of the film was removed by plasma etching. Conditions of plasma etching were the same as in Example 1.

Further, a protective film having the concentration of fluorine lower than that contained in the inside of film was formed on the above-mentioned halftone phase shifting film under the under-mentioned conditions, by which blanks for halftone phase shifting photomask were obtained, wherein the thickness of the halftone phase shifting film was 30nm.
Conditions:
 Film deposition equipment: DC magnetron equipment
 Target: metallic chromium
 Pressure of sputter: 3.0 mm
 Electric current of sputter: 2.0 ampere Phase difference and transmittance at wave length 193 nm in the halftone phase shifting film are measured by the phase difference meter for phase shifting photomask "MPM 193" (manufactured by LASER TECK Co., Ltd.) put on the market Phase. The measure value of phase difference was about 183° and the measured value of transmittance was 10%.

After ArF excimer laser beam of 193 nm was applied to the blanks for halftone phase shifting photomask under the conditions mentioned below, the phase difference and transmittance at wave length 193 nm were measured, wherein conditions of irradiation of laser were the same as in Examples 1, 3.

Figure 12:
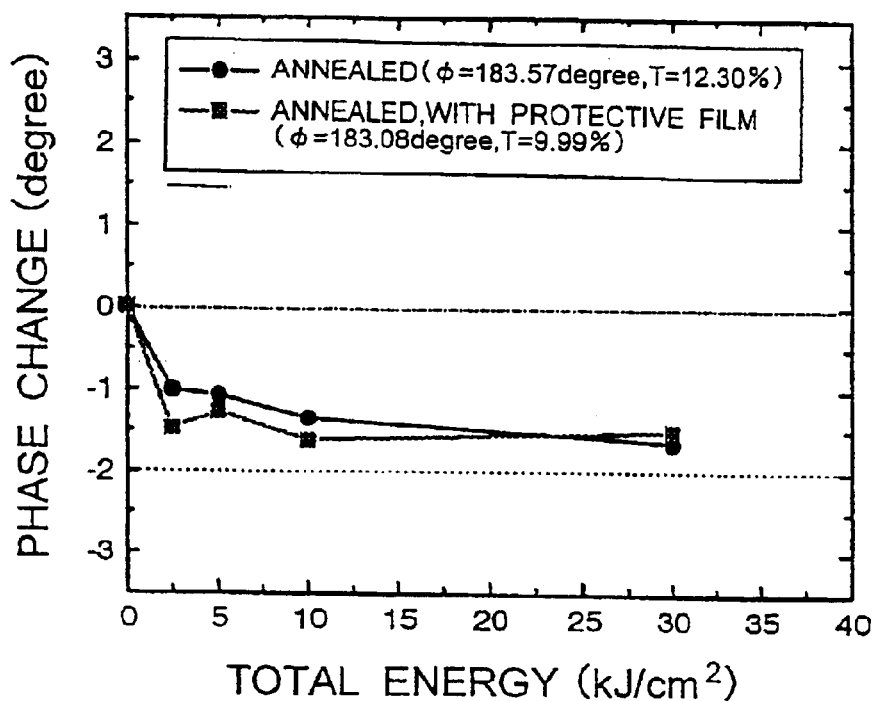
FIGS. 12(a) and 12(b) are graphical views showing the phase difference change and the transmittance change due to applying the excimer laser to a halftone phase shifting photomask having the halftone phase shifting film of Example 4.
Figure 12:
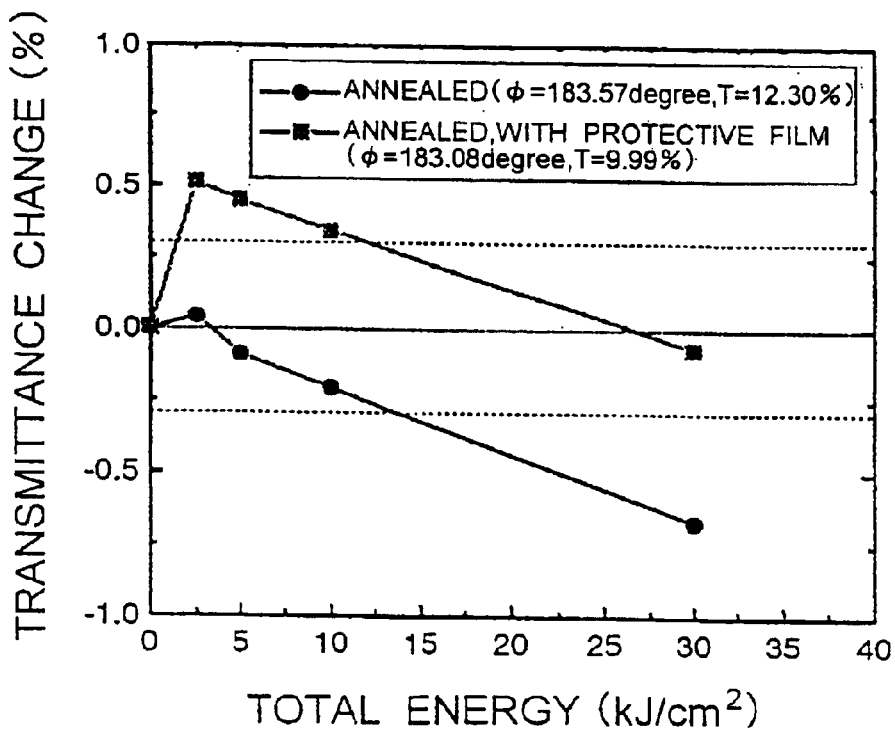

In this case, the application of laser to the halftone phase shifting film was made from the side of substrate. FIGS. 12($a$) and 12($b$) show the result thereof, wherein the result of Example 3 is shown together with the result of Example 4. The difference between phase difference changes of the two was not found. For transmittance, it was found that in a case where a protective film was provided on the halftone phase, the transmittance rises in a region where the amounts of irradiation is low, but thereafter is reduced.

Then, in the same manner as in Example 1, halftone phase shifting film of the blanks for halftone phase shifting photomask was formed into a pattern to produce a photomask.

The obtained halftone phase shifting photomask is shown in FIGS. 12($a$) and 12($b$). Since the production of halftone phase shifting photomask is carried out using blanks for halftone phase shifting with the stable optical property, phase difference change and transmittance produced in the process of transferring of pattern are lessened to improve the practicability.

As apparent from the above-mentioned description, a halftone phase shifting photomask and blanks for halftone phase shifting photomask of the present invention, a change in the property of halftone phase shifting film produced by the, application of a laser beam to the film is produced before the film is used practically so that the property thereof is stabilized, or a protective film is provided on the halftone phase shifting film, or the two means are used together, by which phase the difference change and transmittance change produced when using the photomask can be reduced. As a result, the most suitable halftone phase shifting photomask with the excellent practicability can be obtained.

What is claimed is:

1. Blanks for a halftone phase shifting photomask each having a halftone phase shifting film containing at least chromium and fluorine on a transparent substrate, characterized in that the halftone phase shifting film is heat-treated at a temperature between 250° C. and 500° C. so that a change of the optical property of the halftone phase shifting film produced by the application of excimer laser for exposure to the halftone phase shifting film is decreased.

2. Blanks for a halftone phase shifting photomask each having a halftone phase shifting film containing at least chromium and fluorine on a transparent substrate, characterized in that the halftone phase shifting film is heat-treated at a temperature between 250° C. and 500° C., and that the heat-treated surface of the halftone phase shifting film is removed by etching the surface thereof so that a change of the optical property of the halftone phase shifting film produced by the application of excimer laser for exposure to the halftone phase shifting film is decreased and a change of the transmittance thereof is increased.

3. Blanks for a halftone phase shifting photomask each having a halftone phase shifting film containing at least chromium and fluorine on a transparent substrate, characterized in that the halftone phase shifting film is heat-treated at a temperature between 250° C. and 500° C., and that the heat-treated surface of the halftone phase shifting film is removed by etching the surface and thereafter a protective film is provided on the halftone phase shifting film so that a change of the optical property of the halftone phase shifting film produced by the application of excimer laser for exposure to the halftone phase shifting film is decreased and a change of the transmittance thereof is increased.

4. Blanks for a halftone phase shifting photomask each having a halftone phase shifting film containing at least chromium and fluorine on a transparent substrate, characterized in that a protective film is provided on the halftone phase shifting film, that thereafter the halftone phase shifting film having the protective film is heat-treated at a temperature between 250° C. and 500° C., and that thereafter the surface of the halftone phase shifting film is removed by etching the surface so that a change of the optical property of the halftone phase shifting film produced by the application of excimer laser for exposure to the halftone phase shifting film is decreased.

5. Blanks for a halftone phase shifting photomask each having a halftone phase shifting film containing at least chromium and fluorine on a transparent substrate, characterized in that a protective film is provided on the halftone phase shifting film, and that thereafter the halftone phase shifting film having the protective film is heat-treated at a temperature between 250° C. and 500° C. so that a change of the optical property of the halftone phase shifting film produced by the application of excimer laser for exposure to the halftone phase shifting film is decreased, and a change of the transmittance thereof is increased.

6. Blanks for a halftone phase shifting photomask as claimed in any of claims 1 to 5, wherein the heat-treated surface of the halftone phase shifting film contains at least chromium and the amount of fluorine contained in the surface is less than that contained in the inside of the halftone phase shifting film.

7. Blanks for a halftone phase shifting photomask as claimed in any of claims 3 to 5, wherein the protective film contains at least chromium and the amount of fluorine contained in the protective film is less than that contained in the halftone phase shifting film.

8. Blanks for a halftone phase shifting photomask as claimed in any of claims 1 to 5, wherein the halftone phase shifting film comprises a plurality of layers with an interface defined in the inside of the halftone shifting film between said layers and the interface existing in the inside disappears through the heat-treatment.

9. A halftone phase shifting photomask produced by using the blanks for a halftone phase shifting photomask as claimed in any of claims 1 to 5, characterized in that the halftone phase shifting film is formed into a pattern after the above-mentioned heat treatment has been made.

10. A halftone phase shifting photomask having a halftone phase shifting film containing at least chromium and fluorine on a transparent substrate, characterized in that the halftone phase shifting film is heat-treated at a temperature between 250° C. and 500° C., that the heat-treated halftone phase shifting film is formed into a pattern, and that a protective film is formed on the formed halftone phase shifting film, so that a change of the optical property produced by the application of excimer laser for exposure to the halftone phase shifting film is decreased.

11. A halftone phase shifting photomask having a halftone phase shifting film containing at least chromium and fluorine on a transparent substrate, characterized in that the halftone phase shifting film is heat-treated at a temperature between 250° C. and 500° C., that the surface of the heat-treated halftone phase shifting film is removed by etching the surface, that the halftone phase shifting film is then formed into a pattern and that a protective film is formed on the formed halftone phase shifting film, so that a change of the optical property produced by the application of excimer laser for exposure to the halftone phase shifting film is decreased and a change of the transmittance of the halftone phase shifting film is increased.

12. A halftone phase shifting photomask having a halftone phase shifting film containing at least chromium and fluorine on a transparent substrate, characterized in that the halftone phase shifting film is then formed into a pattern through pattern exposure and that thereafter, the halftone phase shifting film is heat-treated at a temperature between 250° C. and 500° C., so that a change of the optical property of the halftone phase shifting film produced by the application of excimer laser for exposure to the film is decreased.

13. A halftone phase shifting photomask having a halftone phase shifting film containing at least chromium and fluorine on a transparent substrate, characterized in that the halftone phase shifting film is formed into a pattern through pattern exposure, the surface of the halftone phase shifting film is heat-treated at a temperature between 250° C. and 500° C. and that the surface of the heat-treated film is removed by etching the surface so that a change of the optical property of the halftone phase shifting film caused by excimer laser for exposure applied to the film is decreased.

14. A halftone phase shifting photomask having a halftone phase shifting film containing at least chromium and fluorine on a transparent substrate, characterized in that the halftone phase shifting film is formed into a pattern through pattern exposure, that the surface of the halftone phase shifting film is heat-treated at a temperature between 250° C. and 500° C., that the surface of the heat-treated film is removed by etching the surface and that a protective film is then formed on the halftone phase shifting film so that a change of the optical property produced by excimer laser for exposure applied to the film is decreased and a change of the transmittance of the halftone phase shifting film is increased.

15. The halftone phase shifting photomask as claimed in any of claims 10, 11, 14 characterized in that the protective film contains at least chromium, and the amount of fluorine contained in the protective film is less than that contained in the halftone phase shifting film.

16. The halftone phase shifting photomask as claimed in any of claims 10, 11, 14 characterized in that the protective film is a transparent film.

17. The halftone phase shifting photomask as claimed in any of claims 10 to 14 characterized in that the halftone phase shifting film comprises a plurality of layers with an interface defined in the inside of the halftone shifting film between said layers and the interface existing in the inside of the halftone phase shifting film disappears.

18. The halftone phase shifting photomask as claimed in any of claims 10, 11, and 14 characterized in that a pattern size of the pattern is made lesser than that of an objectionable size, when the halftone phase shifting film is formed into the pattern through the pattern exposure.

19. A method of forming a pattern characterized in that the halftone phase shifting photomask as claimed in any of claims 10 to 14 is used.

* * * * *